(12) United States Patent
Xiao et al.

(10) Patent No.: US 11,109,161 B2
(45) Date of Patent: Aug. 31, 2021

(54) SOUND DEVICE

(71) Applicant: AAC Technologies Pte. Ltd., Singapore (SG)

(72) Inventors: Bo Xiao, Shenzhen (CN); Xiaodong Liu, Shenzhen (CN); Ronglin Linghu, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 32 days.

(21) Appl. No.: 16/702,549

(22) Filed: Dec. 4, 2019

(65) Prior Publication Data
US 2020/0213767 A1  Jul. 2, 2020

(30) Foreign Application Priority Data

Dec. 28, 2018 (CN) .......................... 201822240240.5

(51) Int. Cl.
*H04R 17/00* (2006.01)
*H01L 41/187* (2006.01)
*H04R 1/02* (2006.01)

(52) U.S. Cl.
CPC ........... *H04R 17/00* (2013.01); *H01L 41/187* (2013.01); *H04R 1/026* (2013.01)

(58) Field of Classification Search
CPC ........ H04R 17/00; H04R 1/026; H01L 41/187
See application file for complete search history.

(56) References Cited

U.S. PATENT DOCUMENTS

| 7,701,119 | B2 * | 4/2010 | Onishi | H04R 17/00 310/328 |
| 8,989,412 | B2 * | 3/2015 | Fujise | H04R 17/00 381/190 |
| 2011/0176695 | A1 * | 7/2011 | Bai | H04R 31/00 381/190 |

FOREIGN PATENT DOCUMENTS

CN 202957971 B1 5/2013

OTHER PUBLICATIONS

PCT search report dated Jan. 23, 2020 by SIPO in related PCT Patent Application No. PCT/CN2019/113313 (8 Pages).

* cited by examiner

*Primary Examiner* — Andrew L Sniezek
(74) *Attorney, Agent, or Firm* — W&G Law Group LLP

(57) ABSTRACT

The present invention provides a sound device, which includes a bottom plate, a support fixed to the bottom plate, a frame arranged on the support, and a diaphragm fixed to the frame. The sound device further includes a first piezoelectric ceramic sheet and a second piezoelectric ceramic sheet that are disposed separately on the support, and the first piezoelectric ceramic sheet and the second piezoelectric ceramic sheet are respectively provided with a transmission member abutting against the diaphragm. The sound device in the present disclosure can increase a driving force, increase a vibration amplitude, enhance a product sensitivity, broaden a response range, increase a driving fulcrum, improve a vibration balance, and avoid a product distortion.

6 Claims, 2 Drawing Sheets

SOUND DEVICE

TECHNICAL FIELD

The present disclosure relates to electroacoustic devices, in particular to a sound device.

BACKGROUND

A sound device is an electroacoustic device that converts an audio electrical signal into a sound signal, and is widely used in communication terminal devices such as a mobile phone, a fixed telephone, and an earphone, to realize an audio output.

A driving structure composed of a voice coil and a magnetic steel is usually used in common sound devices. The voice coil is energized to generate an electromagnetic induction force with the magnetic steel, thus driving a diaphragm to vibrate and sound.

The sound device in related technologies adopts a piezoelectric ceramic sheet as the driving structure to replace a combination of the voice coil and the magnetic steel. The piezoelectric ceramic sheet is provided with a transmission member abutting against the diaphragm, and a deformation generated by energizing the piezoelectric ceramic sheet is transmitted to the diaphragm through the transmission member, thereby driving the diaphragm to vibrate and sound. However, an abutting position between the single transmission member and the diaphragm is very critical, because a poor abutting position easily causes the diaphragm to suffer from a poor vibration, a distortion, an insufficient driving force and a poor sensitivity.

Therefore, it is necessary to provide a new sound device with an improved driving structure.

DETAILED DESCRIPTION

The present disclosure is further described in detail below with reference to accompanying drawings and specific embodiments in order to provide a better understanding of a solution of the present disclosure and advantages in various aspects. Further, the following specific embodiments are provided to facilitate a clearer understanding of the contents of the present disclosure, not to limit the present disclosure.

Figure 1:
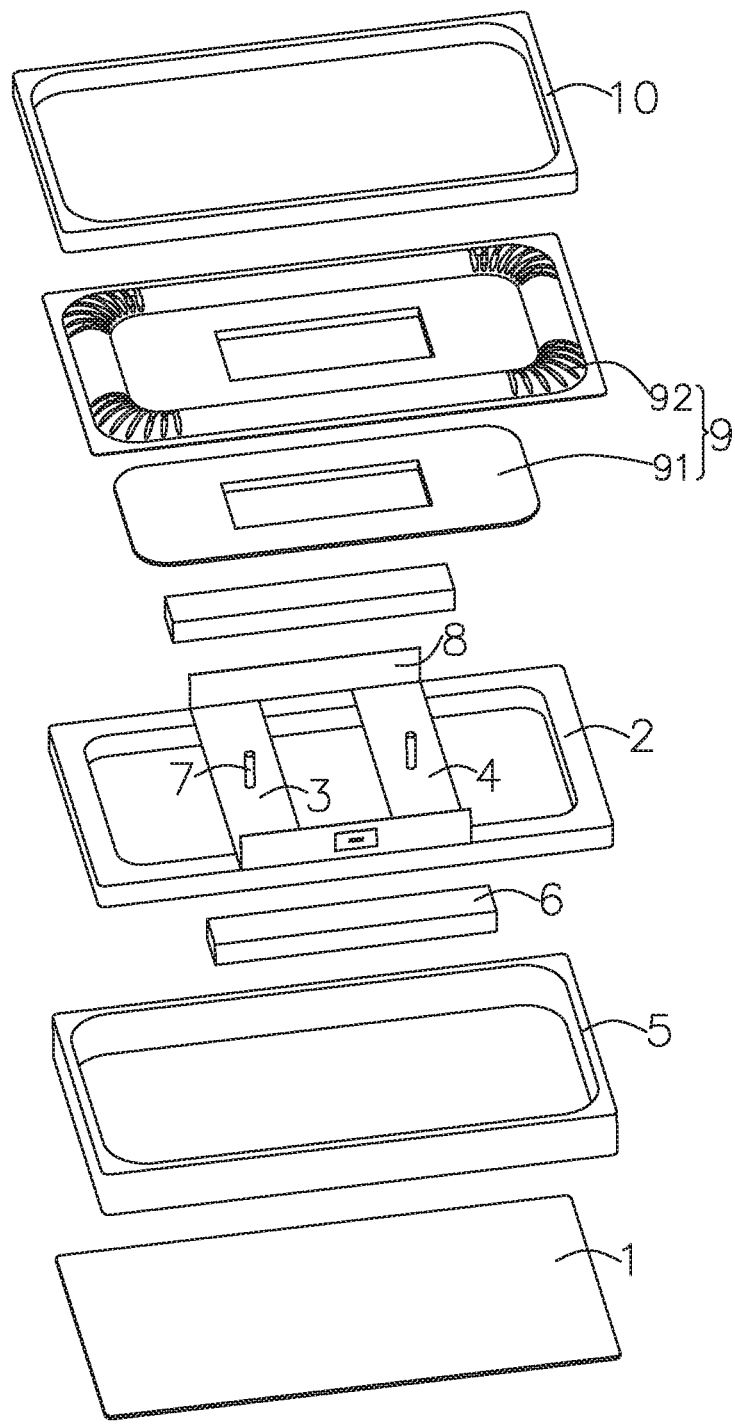
FIG. 1 is a schematic exploded perspective structural view of a sound device in the present disclosure.
Figure 2:
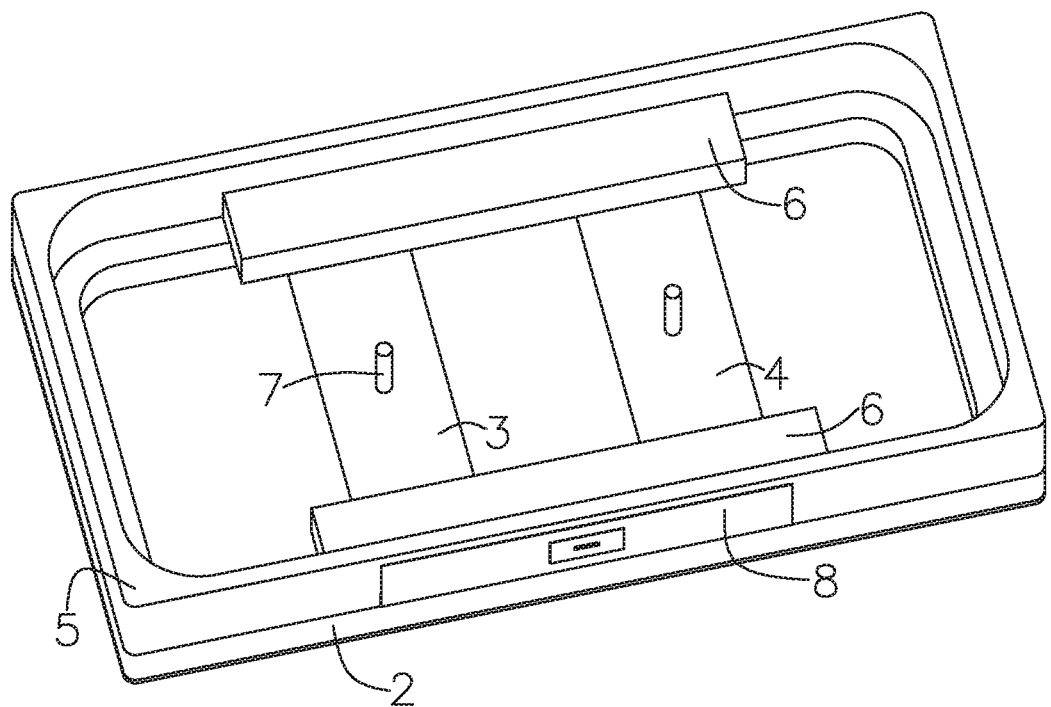
FIG. 2 is a schematic partial perspective structural view of the sound device in the present disclosure.
Figure 3:
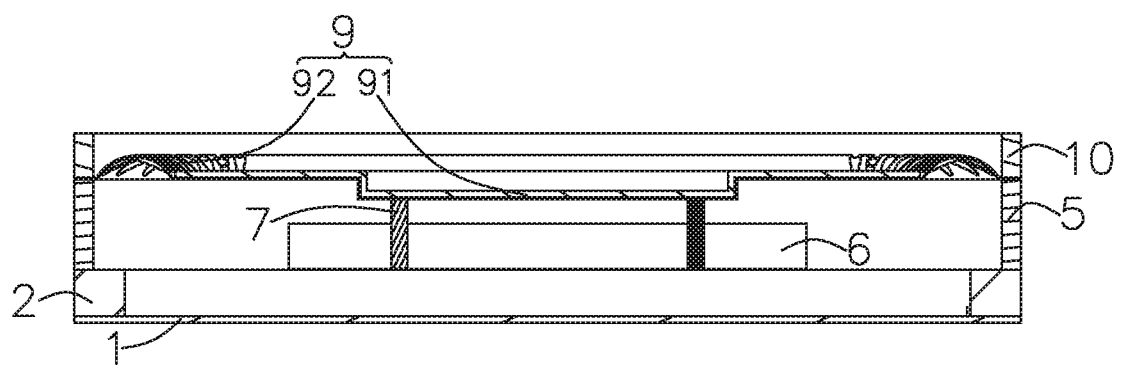
FIG. 3 a schematic sectional structural view of the sound device in the present disclosure.

As shown in FIGS. 1 to 3, the present disclosure provides a sound device which includes a bottom plate 1, a support 2 fixed to the bottom plate 1, a first piezoelectric ceramic sheet 3 and a second piezoelectric ceramic sheet 4 that are disposed separately on the support 2, a frame 5 arranged on the support 2, a diaphragm 9 fixed to the frame 5, and a front cover 10 pressed on the diaphragm 9.

Both the support 2 and the frame 5 are hollow annular members. An outer contour of an orthogonal projection of the support 2 on the bottom plate 1 coincides with an outer contour of an orthogonal projection of the frame 5 on the bottom plate 1, and an inner contour of an orthogonal projection of the support 2 on the bottom plate 1 is closer to a center side than an inner contour of an orthogonal projection of the frame 5 on the bottom plate 1. The first piezoelectric ceramic sheet 3 and the second piezoelectric ceramic sheet 4 are provided with a pressing block 6 abutting against an inner wall surface of the frame 5, and the pressing block 6 presses the first piezoelectric ceramic sheet 3 and the second piezoelectric ceramic sheet 4 against the support 2. A transmission member 7 is further respectively arranged at a central region of the first piezoelectric ceramic sheet 3 and at a central region of the second piezoelectric ceramic sheet 4, and the transmission member 7 abuts against the diaphragm 9. The first piezoelectric ceramic sheet 3 and the second piezoelectric ceramic sheet 4 are connected in parallel to drive the diaphragm 9. Preferably, the first piezoelectric ceramic sheet 3 and the second piezoelectric ceramic sheet 4 are arranged in parallel. A deformation generated by energizing the piezoelectric ceramic sheet is transmitted to the diaphragm 9 through the transmission member 7.

Further, the diaphragm 9 includes a dome 91 and a folded ring 92 bent and extending from the dome 91. The dome 91 and the folded ring 92 may be a separate structure or an integrated structure. The transmission member 7 is columnar and abuts against the dome 91 of the diaphragm 9.

In this embodiment, the first piezoelectric ceramic sheet 3 and the second piezoelectric ceramic sheet 4 are connected by a connecting member 8. Preferably, the connecting member 8 is arranged on an outer wall surface of the frame 5 and connects the first piezoelectric ceramic sheet 3 and the second piezoelectric ceramic sheet 4. In other embodiments, the connecting member 8 may alternatively be arranged on the outer wall surface of the support 2. The connecting member 8 may be used as an electrical connecting terminal of the piezoelectric ceramic sheet, and may further ensure a relative position between the two piezoelectric ceramic sheets. The forgoing description is only for an illustrative purpose and is not to be construed as limiting the present disclosure.

Comparing with existing technologies, the sound device in the present disclosure can increase a driving force, increase a vibration amplitude, enhance a product sensitivity, broaden a response range, increase a driving fulcrum, improve a vibration balance, and avoid a product distortion.

It should be noted that, for those skilled in the art, various changes and modifications may be made without departing from the inventive concept of the present disclosure, and all these changes and modifications fall within the protection scope of the present disclosure.

What is claimed is:

1. A sound device, comprising a bottom plate, a support fixed to the bottom plate, a frame arranged on the support, and a diaphragm fixed to the frame, wherein the sound device further comprises a first piezoelectric ceramic sheet and a second piezoelectric ceramic sheet that are disposed separately on the support, and the first piezoelectric ceramic sheet and the second piezoelectric ceramic sheet are respectively provided with a transmission member abutting against the diaphragm, the first piezoelectric ceramic sheet and the second piezoelectric ceramic sheet are further provided with a pressing block, and the pressing block presses the first piezoelectric ceramic sheet and the second piezoelectric ceramic sheet against the support.

2. The sound device in accordance with claim 1, wherein the first piezoelectric ceramic sheet and the second piezoelectric ceramic sheet are arranged in parallel.

3. The sound device in accordance with claim 1, wherein the first piezoelectric ceramic sheet and the second piezoelectric ceramic sheet are connected by a connecting member arranged on an outer wall surface of the frame or the outer wall surface of the support.

4. The sound device in accordance with claim 1, wherein the first piezoelectric ceramic sheet and the second piezoelectric ceramic sheet are connected in parallel.

5. The sound device in accordance with claim 1, wherein the diaphragm comprises a dome and a folded ring arranged around the dome, and the transmission member is columnar and abuts against the dome.

6. The sound device in accordance with claim 1, wherein the transmission member is respectively arranged at a central region of the first piezoelectric ceramic sheet and at a central region of the second piezoelectric ceramic sheet.

* * * * *